(12) United States Patent
Robin et al.

(10) Patent No.: US 9,401,454 B2
(45) Date of Patent: Jul. 26, 2016

(54) SEMICONDUCTING STRUCTURE WITH SWITCHABLE EMISSION ZONES, METHOD OF MANUFACTURING SUCH A STRUCTURE AND SEMICONDUCTING DEVICE COMPRISING SUCH A STRUCTURE

(71) Applicant: COMMISSARIAT A L'ENERGIE ATOMIQUE ET AUX ENE ALT, Paris (FR)

(72) Inventors: Ivan-Christophe Robin, Grenoble (FR); Alexei Tchelnokov, Meylan (FR)

(73) Assignee: Commissariat àL'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/467,398

(22) Filed: Aug. 25, 2014

(65) Prior Publication Data

US 2015/0060904 A1  Mar. 5, 2015

(30) Foreign Application Priority Data

Aug. 28, 2013 (FR) ...................................... 13 58242

(51) Int. Cl.
*H01L 29/20* (2006.01)
*H01L 33/08* (2010.01)
(Continued)

(52) U.S. Cl.
CPC .............. *H01L 33/08* (2013.01); *H01L 33/005* (2013.01); *H01L 33/0041* (2013.01); *H01L 33/06* (2013.01); *H01L 33/14* (2013.01); *H01L 2933/0025* (2013.01)

(58) Field of Classification Search
CPC ..... H01L 33/08; H01L 33/0041; H01L 33/06; H01L 33/005

USPC .......................................................... 257/89
See application file for complete search history.

(56) References Cited

U.S. PATENT DOCUMENTS 5,851,905 A    12/1998  McIntosh et al.
2009/0311528 A1  12/2009  Robin et al.
(Continued)

FOREIGN PATENT DOCUMENTS

EP         2 149 919 A1    2/2010
FR      EP 2843715 A1 *    3/2015    ............ H01L 33/005
KR   WO 2010126286 A1 *   11/2010    .......... G02F 1/01716

OTHER PUBLICATIONS

French Preliminary Search Report issued May 13, 2014, in French Application No. 13 58242 filed Aug. 28, 2013 (with English Translation of Categories of Cited Documents).
(Continued)

*Primary Examiner* — Douglas Menz
(74) *Attorney, Agent, or Firm* — Oblon, McClelland, Maier & Neustadt, L.L.P.

(57) ABSTRACT

The invention relates to a semiconducting structure intended to emit light, comprising a first semiconducting region (10) with a first type of conductivity, and a second semiconducting region (20) with a second type of conductivity, at least on a portion (220, 210), so as to form a junction semiconducting with the first region (10). This second region (20) has at least a first portion (210) in contact with the first region (10), this first portion (210) comprising at least one first and one second carrier confinement zone (211, 212). The structure (1) comprises at least a first means of polarizing the first portion (210) adapted to apply direct first external polarization to the first portion (210) in order to modify the distribution of carriers of at least one type of conductivity in the first portion (210) relative to the first and second confinement zones (211, 212). The invention also relates to a method of manufacturing a semiconducting structure (1) and a device comprising at least such a structure (1).

14 Claims, 11 Drawing Sheets

(51) Int. Cl.
*H01L 33/00* (2010.01)
*H01L 33/06* (2010.01)
*H01L 33/14* (2010.01)

(56) References Cited

U.S. PATENT DOCUMENTS

| | | |
|---|---|---|
| 2010/0025654 A1 | 2/2010 | Robin et al. |
| 2010/0142580 A1 | 6/2010 | Gilet et al. |
| 2011/0001121 A1 | 1/2011 | Ahn |
| 2014/0097401 A1 | 4/2014 | Robin et al. |
| 2014/0235014 A1 | 8/2014 | Robin et al. |
| 2015/0060904 A1* | 3/2015 | Robin ............... H01L 33/005 257/89 |

OTHER PUBLICATIONS

U.S. Appl. No. 14/750,156, filed Jun. 25, 2015, Robin, et al.
U.S. Appl. No. 14/748,707, filed Jun. 24, 2015, Bono, et al.
French Preliminary Report issued May 19, 2014 in Patent Application No. 1358242 with English Translation of Category of Cited Documents.
Aurelien David et al., "Carrier Distribution in (0001)InGaN/GaN Multiple Quantum Well Light-emitting Diodes", Applied Physics Letters 92, 2008, pp. 053502-1-053502-3 and cover page.
Sang-Heon Han et al., "Effect of Electron Blocking Layer on Efficiency Droop in InGaN/GaN Multiple Quantum Well Light-emitting Diodes", Applied Physics Letters 94, 2009, pp. 231123-1-231123-3.

* cited by examiner

SEMICONDUCTING STRUCTURE WITH SWITCHABLE EMISSION ZONES, METHOD OF MANUFACTURING SUCH A STRUCTURE AND SEMICONDUCTING DEVICE COMPRISING SUCH A STRUCTURE

TECHNICAL DOMAIN

The invention relates to the domain of light emitting devices.

Semiconducting structures designed to emit light have become inevitable over the last decade for lighting and also for information display, as part of an ongoing attempt to improve the energy efficiency of daily used apparatus.

Thus, intense research is currently focussed on these structures to improve their performances, particularly concerning emission efficiencies and possibilities of varying possible lighting conditions.

Therefore, the invention is most particularly applicable to a semiconducting structure with switchable emission zones, a method of manufacturing such a structure and a device comprising such a structure.

STATE OF PRIOR ART

Semiconducting structures designed to emit light usually contain two semiconducting regions in contact with each other, the first semiconducting region having a first type of conductivity and the second semiconducting region comprising at least one portion having a second type of conductivity. Thus, semiconducting structures have a semiconducting junction between their first and second semiconducting regions.

The second region of this type of semiconducting structure usually has a first portion comprising a concentration of majority carriers lower than the concentration in the first region, such that the junction extends mainly in said second region and recombinations of electron-hole pairs generating photons take place mainly in this first portion. This is usually achieved through the use of a non-intentionally doped type first portion.

In the above and throughout the remainder of this document, semiconducting junction refers to the space charge zone that is created at the junction between two semiconducting regions with opposite types of conductivity, for example such as between two semiconducting regions, one of which has the type of conductivity in which the majority carriers are electrons and the other has the type of conductivity in which the majority carriers are holes.

In the above and in the remainder of this document, "non-intentionally doped type" means that the semiconducting region or the portion of the semiconducting region is made from a material in which no doping elements were intentionally added during its formation. Thus, such a region or portion of a region has a concentration of majority carriers that remains for example of the order of $10^{16}$ cm$^{-1}$ for the case of gallium nitride GaN with a conductivity of the type in which the majority carriers are electrons.

In order to optimise the ratio of electron-hole pair combinations in this first portion, this portion also comprises at least a confinement zone capable of confining at least one type of carrier such as quantum wells.

Thus, such structures can provide light emission with better energy efficiency than incandescent light sources or fluo-compact tubes. Nevertheless, if such a confinement zone can optimise the number of electron-hole pair recombinations, these combinations take place mainly in this confinement zone and therefore the volume in which the recombinations take place is relatively small. The result is a limited maximum emission capacity.

This problem can be overcome in a known manner by forming a plurality, typically 3 to 6, of confinement zones to increase the volume in which electron-hole pair combinations take place.

Nevertheless, if the multiplication of confinement zones can theoretically increase the volume in which electron-hole pair recombinations take place, calculations and experiments on such structures like those described in the work done by A. DAVID et al. published in 2008 in the "Applied Physics Letters" Scientific Journal No. 92 pages 053502 and the work done by S. H. HAN et al. published in 2009 in the "Applied Physics letters" Scientific Journal No. 94 pages 231123, showed that electron-hole pair recombinations actually take place only in one of the confinement zones.

PRESENTATION OF THE INVENTION

This invention is intended to overcome this disadvantage.

Therefore one purpose of this invention is to provide a semiconducting structure that will emit light and that, comprising at least two carrier confinement zones, enables light emission with recombinations of electron-hole pairs that take place mainly in at least two confinement zones.

Another purpose of the invention is to provide a semiconducting structure that will emit light and that, comprising at least two confinement zones, enables switching of the confinement zone(s) in which the recombinations of electron-hole pairs take place, and that could enable the modification of the respective emitting rate of each confinement zone to allow a modification of the emitting spectrum of the structure.

One particular purpose of the invention is to enable the supply of a semiconducting structure for which the emission wavelength can be adapted depending on needs.

To achieve this, the invention applies to a semiconducting structure that will emit light, comprising:
  a first semiconducting region with a first type of conductivity;
  a second semiconducting region with a second type of conductivity, at least on one portion, so as to form a semiconducting junction with the first region, this second region having at least one first portion in contact with the first region and in which the semiconducting junction extends at least partially, this first portion comprising at least one first and one second carrier confinement zone for at least one type of carrier,
  the structure comprising at least one first means of polarising the first portion adapted to apply direct external polarisation to the first portion in order to modify the distribution of carriers of at least one type of conductivity relative to the first and the second confinement zones.

This change in the distribution of carriers of at least one type of conductivity relative to the first and the second confinement zones makes it possible to select the confinement zone(s) in which light emission takes place.

The first and the second confinement zones have different band gap widths.

The first polarisation means may be a Schottky gate or contact so as apply direct external polarisation to the first portion without injection of carriers from this polarisation means, such a polarisation means is different from a resistive type of electrical contact that causes the injection of carriers during application of polarisation and therefore does not include simple submission to polarisation.

In the above and in the remainder of this document, the expression "modification to the distribution of carriers of at least one type of conductivity" means that the polarisation means is adapted to modify the distribution of carriers of at least one type of conductivity while creating either an accumulation zone or a depletion zone or even an inversion zone for this type of carrier, by field effect. Such a modification to the carrier distribution can modify the distribution of current lines in the semiconducting zone concerned and the distribution of the space charge zone that extends in this semiconducting zone. In the case in which the semiconducting zone is of the non-intentionally doped type and therefore has only slightly polarised conductivity, the concentration of majority carriers is affected by adjacent zones and therefore holes and electrons can be accumulated for this type of semiconducting zone.

Obviously, a modification to the distribution of carriers of one type of conductivity does not mean that said polarisation means affects the distribution of carriers with the other type of conductivity.

With such a structure, implementation of the first polarisation means can modify the distribution of carriers of at least one type of conductivity in the first portion relative to the first and the second confinement zones, due to a field effect. Thus, this distribution can be modified so as to select the confinement zone in one of the two confinement zones in which most light emission takes place. With polarisation of the light emission, it is also possible to modify the distribution of carriers of at least one type of conductivity such that emission takes place in both the first and the second confinement zones. Thus, the volume in which recombinations of electron-hole pairs take place is larger than in structures according to prior art that do not have such a first polarisation means. The latter possibility makes it possible to increase the emission capacity of such a structure in comparison with structures according to prior art.

Furthermore, with such a structure, in the case in which confinement zones are adapted to have band gaps and therefore emission wavelengths different from each other, the emission wavelength of the structure can be changed by modifying the distribution of carriers of at least one type of conductivity relative to confinement zones, using the first polarisation means.

The first portion may have a lower concentration of majority carriers than the first region, the concentration of majority carriers in the first portion of the second region preferably being less than the concentration in the first region by a factor of at least ten or even fifty.

The first portion may be of the non-intentionally doped type.

Such a low concentration of majority carriers in the first portion of the second region in comparison with the first region is particularly conducive to obtaining a significant modification to the distribution of carriers, equally with the first type of conductivity and with the second type of conductivity. Thus, the voltage to be applied to the first polarisation means to modify the distribution of the given junction remains less than it is for a structure in which a first portion of the second region has a higher concentration of majority carriers.

Each confinement zone may comprise a quantum well for at least one type of carrier.

The portion with the second type of conductivity, called the second portion, may be distinct from the first portion.

Thus the invention also relates to a semiconducting structure, designed to emit light, comprising:

a first semiconducting region with a first type of conductivity, a second semiconducting region with at least one first and one second portion, the first portion being in contact with the first region and comprising a lower concentration of majority carriers than the first region, the second portion having a second type of conductivity opposite the first type of conductivity so as to form a semiconducting junction with the first region that extends in the first portion, this first portion comprising at least one first and one second confinement zones of carriers for at least one type of carrier, the structure comprising at least one first means of polarising the first portion adapted to apply direct external polarisation to the first portion in order to modify the distribution of carriers of at least one type of conductivity in the first portion relative to the first and the second confinement zones.

Such a structure benefits from the invention particularly due to its first portion. The semiconducting junction in such a structure extends mainly in this first portion and therefore can easily be modulated so as to select the confinement zone(s) in which emission takes place.

The first portion may be of the non-intentionally doped type.

Such a first portion of the second region is particularly conducive to a significant modification to the distribution of carriers with the first and the second types of conductivity. Only a small quantity of carriers with one type of conductivity is necessary to modify the distribution of carriers and thus modify the distribution of emission between the first and the second confinement zones.

In the above and throughout the remainder of this document, "a carrier type" refers to carriers corresponding to one type of conductivity, in other words majority carriers with the type of conductivity. Thus, as mentioned in this document, the first and the second types of carrier refer to the majority carriers with the first type and the second type of conductivity respectively. Similarly, carriers with the first and second types of conductivity refer to majority carriers with the first type and the second type of conductivity respectively.

The first portion may be the portion with the second type of conductivity in the second region.

Thus the invention also relates to a semiconducting structure designed to emit light, comprising:

a first semiconducting region with a first type of conductivity, a second semiconducting region with a second type of conductivity on at least one first portion so as to form a semiconducting junction with the first region, this first portion being in contact with the first region and in which the semiconducting junction extends, this first portion comprising at least one first and one second carrier confinement zones for at least one type of carrier, the structure comprising at least one first means of polarising the first portion adapted to apply direct external polarisation to the first portion so as to modify the distribution of carriers with at least one type of conductivity in the first portion relative to the first and the second confinement zones.

Such a structure may be obtained with a smaller number of manufacturing steps than a structure with a second region comprising two distinct portions. The second region can be formed in a single step without requiring an additional doping or growth step other than the steps necessary to form the first portion of the second region.

The first polarisation means can be located closer to the second portion than the first region or closer to the first region than the second portion such that this polarisation means causes a modification to the distribution of carriers with the second type of conductivity and with the first type of conductivity in the first portion, respectively.

Such a first polarisation means can modify the distribution of carriers of either the first or the second type of conductivity relative to the first and the second confinement zones, that is particularly efficient for this type of conductivity, the first mean being located close to a semiconducting zone supplying a reservoir of carriers with this type of conductivity.

The first polarisation means may be located closer to the second portion than to the first region such that polarisation of the latter will cause a modification to the distribution of carriers with the second type of conductivity in the first portion.

The first polarisation means may be located closer to the first region than to the second portion such that polarisation of the latter will cause a modification to the distribution of carriers with the first type of conductivity in the first portion.

The first polarisation means may be located at approximately equal distances from the second portion and the first region such that polarisation of the latter will cause a modification to the distribution of carriers with the first and with the second type of conductivity in the first portion.

In such a configuration, since the first means is at equal distances from semiconducting zones with the first and the second types of conductivity, the first means can affect the distribution of carriers of the first and the second types of conductivity.

A second polarisation means adapted to apply second direct external polarisation to the first portion can also be provided so as to modify the distribution of carriers of at least one type of conductivity in the first portion relative to the first and the second confinement zones.

Said second polarisation means may be located closer to the other among second portion and the first region relative to the first polarisation means, such that polarisation of this second polarisation means causes a modification to the distribution of carriers of the first and second types of conductivity respectively, in the first portion.

Such second means can modify the distribution of carriers of at least one type of conductivity in parallel but distinctly from the modification generated by the first polarisation means, so as to obtain fine control of the distribution of carriers in the first portion in comparison with the first and second confinement zones. Such a possibility is particularly adapted for a structure comprising more than two confinement zones in the first portion of the second region.

Since the first polarisation means is located close to the second portion, said second polarisation means may be located closer to the first region than the first polarisation means so that polarisation of this second polarisation means modifies the distribution of carriers with the first type of conductivity in the first portion.

Since the first polarisation means is located close to the first region, said second polarisation means may be located closer to the second portion than the first polarisation means such that polarisation of this second polarisation means will modify the distribution of carriers with the second type of conductivity in the first portion.

Furthermore, for a first and second means respectively located close to one an the other among the second portion and the first region, these two polarisation means make it possible to independently modify the distribution in the first portion of carriers with the first and the second types of conductivity, relative to the first and second confinement zones. Thus, the zone(s) in which the emission takes place can be selected by varying the first and second external polarisations.

The first portion may be a layer extending in a layer plane comprising a first and a second face, the first and second confinement zones extending along a layer plane approximately parallel to each other, the second portion of the second region and the first polarisation means being located in a complementary manner on the second face of the first portion.

The first portion of the second region may be in the form of a layer comprising a layer plane and a first and a second face, the first and the second confinement zones extending along the layer plane approximately parallel to each other, and in which the second portion of the second region is in contact with the first portion of this second region on part of the second face of said first portion, the first polarisation means being located to apply a first external polarisation to the first portion along a second part of the second face that is complementary to the first part of the second face.

These two configurations of the structure are particularly suitable for a vertical type structure, in other words formed across the thickness of a semiconducting support.

The first portion of the second region may extend longitudinally along a layer plane from the first region, the first portion having a first and a second longitudinal face, the first and second confinement zones extending along the layer plane facing the first and second faces of the first portion respectively, the first polarisation means being located on the second face of the first portion.

The first portion of the second region may extend longitudinally along a layer plane from the first region, the first portion having a first and a second longitudinal face, the first and second confinement zones extending in the first portion of the second region along the layer plane facing the first and second faces of the first portion of the second region respectively, the first polarisation means being located on the second face of the first portion of the second region such that polarisation of the first polarisation means causes a modification to the distribution of carriers with at least one type of conductivity.

The second portion of the second region may be in contact with the first portion approximately opposite the first region, the first and the second regions being in the form of a layer.

The first portion may extend longitudinally between the first region and the second portion along a layer plane, said first portion having a first and a second longitudinal face, the first and second confinement zones extending in the portion of the second region along the layer plane facing the first and second faces of the first portion of the second region respectively, the first polarisation means being located on the second face of the first portion of the second region close to the second region such that polarisation of the first polarisation means modifies the distribution of carriers with at least one type of conductivity.

The first and the second region may be present in a single layer, this layer defining a layer plane, the first portion extending longitudinally from the first region along the layer plane, said first portion having a first and a second longitudinal face, the first and the second confinement zones extending along the layer plane facing the first and the second faces of the first portion respectively, the first polarisation means being located on the second face of the first portion of the second region such that polarisation of the first polarisation means modifies the distribution of carriers with at least one type of conductivity.

Such configurations are particularly adapted for a planar type structure.

The second polarisation means may be located on the first face or the second face of the first portion of the second region such that polarisation of the second polarisation means will modify the distribution of carriers with the other type of conductivity among the first and the second types of conductivity, in the first portion.

With such a configuration, the confinement zone(s) in which the emission takes place can be precisely controlled.

The first polarisation means may comprise a conducting layer separated from the first portion by a layer of insulating material, said conducting layer being located close to the portion of the second region with the second type of conductivity.

Such a configuration of the first polarisation means is particularly adapted to modify the distribution of at least one type of carrier by field effect.

The second polarisation means may comprise a conducting layer separated from the first portion by a layer of insulating material, said conducting layer being located close to the first region.

The band gaps of the first and the second confinement zones may be different from each other.

Thus, the emission wavelength of the structure can be modulated by modulating the distribution of the junction in the first and second confinement zones and therefore the power emitted in each of these zones.

The second region may also comprise a third confinement zone, the first, second and third confinement zones having band gaps adapted so that emission wavelengths of these confinement zones are distributed over part of the range of visible wavelengths, and preferably over most of the range of visible wavelengths, or even over the entire range of visible wavelengths.

Such a structure can modulate the emission wavelength in the visible range, particularly so that predominantly white light can be emitted by modifying the emission temperature, when the range of visible wavelengths over which emission wavelengths from confinement zones are distributed is appropriate. Thus, with a single structure, it is possible to change from emission of particularly hot white light, in other words tending towards the red, to a particularly cold white light, in other words tending towards the blue.

The first, second and third confinement zones may be adapted to have emission wavelengths in the red, blue and green respectively.

The invention also relates to a method of manufacturing a semiconducting structure comprising the following steps:
  supply a second semiconducting region comprising at least one first portion in which there are first and second carrier confinement zones for at least one type of carriers, said second region having a second type of conductivity, at least on one portion,
  formation of a first semiconducting region with a first type of conductivity in contact with the second region so as to form a semiconducting junction with the portion of the second region that has the second type of conductivity, said junction extending in the first portion of the second region,
  formation of at least one first means of polarising the first portion of the second region adapted to modify the distribution of carriers with at least one type of conductivity in the first portion relative to the first and second confinement zones.

Such a manufacturing method can result in a structure in which the distribution of emission between each confinement zone can be modulated.

The invention also relates to a semiconducting device comprising a plurality of semiconducting structures that will emit light, the device comprising at least one semiconducting structure according to the invention.

The emission from each of the structures according to the invention can be varied to provide a variable display surface for example like a screen. This thus avoids the need to use several structures, each dedicated to one colour, to obtain a variation of the emitted light.

BRIEF DESCRIPTION OF THE DRAWINGS

This invention will be better understood after reading the description of non-limitative example embodiments given purely for information with reference to the appended drawings in which.

The same numbers are used to reference identical, similar or equivalent parts of the different figures so as to facilitate comparisons between the different figures.

Figure 1A:
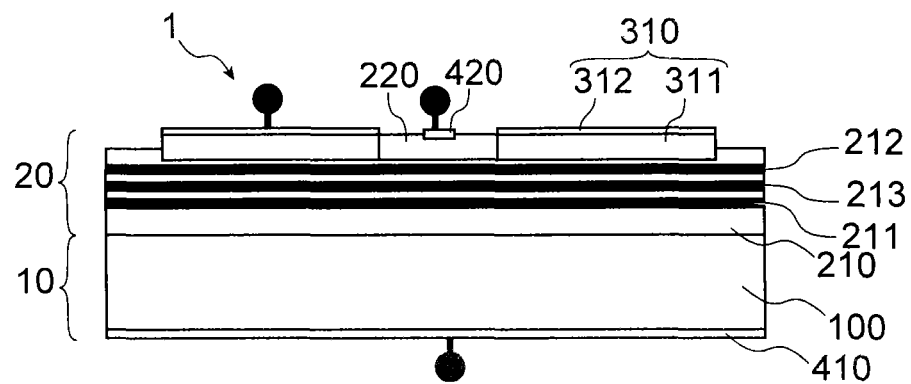
FIGS. 1a to 1e show an example of the semiconducting structure with its operating principle according to a first embodiment of the invention, FIGS. 1a and 1b illustrating a sectional and top views respectively of the structure, FIGS. 1c to 1e illustrating a sectional view during operation in which emission takes place in a first confinement zone, in a first and a second confinement zone, and in a second confinement zone, respectively.

The different parts shown in the figures are not necessarily all at the same scale, to make the figures more easily understandable.

The different possibilities (variants and embodiments) should be understood as not being mutually exclusive and they can be combined with each other.

DETAILED PRESENTATION OF PARTICULAR EMBODIMENTS

FIG. 1 shows a semiconducting structure 1 designed to emit light that comprises several confinement zones in which light emission can take place, and is adapted to enable selection and switching of the confinement zone(s) in which light emission takes place.

Although such a structure according to the invention can be adapted to emit light in a range varying from the deep ultraviolet to the far infrared depending on the materials from which it is made, the following describes a particular application of the invention in which the structure is adapted to emit within a range of visible wavelengths. Thus, the values and materials mentioned below and throughout the remainder of this document, when specified, only concern the particular application and therefore do not in any way limit the scope of the invention.

Such a structure 1 according to a first embodiment of the invention comprises:
- a semiconducting support 100 forming a first semiconducting region 10 with a first type of conductivity,
- a second semiconducting region 20 in contact with the support 100, said second region 20 comprising a first portion 210 of the non-intentionally doped type, comprising three confinement zones 211, 212, 213, and a second portion 220 with a second type of conductivity opposite the first type of conductivity, the first and second portions 210, 220 being located relative to the first region 10 so as to form a semiconducting junction with this first region, extending mainly in the first portion 210,
- first and second electrical contacts 410, 420 suitable for electrically connecting the first and the second regions 10, 20 respectively,
- a first polarisation gate located to apply direct first external polarisation to the first portion 210 to and thus modify the distribution of carriers of the first and second types of conductivity in the first portion 210 relative to the confinement zones 211, 212, 213.

The support 100 as shown in FIG. 1a is an approximately plane semiconducting support with a first and a second face. The support 100 is made from a preferably direct band gap semiconducting material such as gallium nitride GaN or zinc nitride ZnO. The support 100 has the first type of conductivity.

"Direct band gap semiconducting material" means that the semiconducting material has its valence band maximum energy and its conduction band minimum energy values at approximately equal values of the wave vector k in the energy dispersion diagram of said semiconducting material.

In the particular application, the support 100 is made of gallium nitride GaN. According to this application, the first type of conductivity is a type of conductivity in which the majority carriers are electrons. In the particular application, the concentration of majority carriers in the support 100 is greater than or equal to $10^{18}$ cm$^{-3}$.

The second region 20 is in contact with the support and therefore with the first region 10, on its second face by means of the first portion 210 of the second region 20.

As shown in FIG. 1a, the first portion 210 is an approximately plane semiconducting layer that extends along the second face of the support 100. The first portion 210 comprises a layer plane and a first and a second face, the first face of the first portion 210 being in contact with the support 100.

The first portion 210 is made principally from a direct band gap semiconducting material in which the confinement zones 211, 212, 213 are made from at least one other direct band gap semiconducting material. The first portion is preferably of the non-intentionally doped type such that the junction extends over the entire thickness of the first portion. According to this possibility, the concentration of majority carriers may be of the order of $10^{16}$ cm$^{-3}$. It should be noted that as a variant to a first portion of the non-intentionally doped type, this portion may have a first type of conductivity or a second type of conductivity opposite the first type of conductivity.

In the particular application, the first portion is made principally of gallium nitride GaN. According to this particular application, the first portion has the first type of conductivity with a concentration of majority carriers equal to approximately $10^{18}$ cm$^{-3}$.

The first portion 210 comprises the first, second and third confinement zones 211, 212, 213. Each of the confinement zones 211, 212, 213 is formed from a sub-layer of the first portion 210. Thus, the first confinement zone 211 is formed from a sub-layer that extends along the layer plane of the first portion facing the first face of the first portion, while the second confinement zone 212 is facing the second face of the first portion 210. The third confinement zone 213 is formed from a sub-layer that also extends along the layer plane of the first portion 210, located between the first and the second confinement zone 211, 212, in the same way as the sub-layers forming the first and second confinement zones 211, 212. Each confinement zone is between 1 and 10 nm thick, the distance between two subsequent zones being of the same order of magnitude.

According to a first possibility of the invention in which the high emission capacities of the invention are particularly useful, the first, second and third confinement zones 211, 212, 213 may be made from the same material and may have the same dimensional characteristics.

According to a second possibility of the invention in which the capacities of the invention to provide a variable emission wavelength are exploited, the first, second and third confinement zones 211, 212, 213 may be made from different materials and/or their dimensional characteristics may be different from each other, so as to have different emission wavelengths in each of the three confinement zones 211, 212, 213.

According to this second possibility and the particular application, the first, second and third zones 211, 212, 213 are adapted to emit approximately in the violet (wavelength about 420 nm), green (wavelength about 480 nm) and yellow (wavelength about 530 nm) such that their emission wavelengths are distributed within the range of visible wavelengths. To achieve this, the first, second and third zones 211, 212, 213 may be made from indium and gallium nitride $In_xGa_{1-x}N$, for example with proportions of indium equal to 10%, 30% and 20% respectively. In this particular application, the thickness of confinement zones 211, 212, 213 is approximately the same and is between 1 and 10 nm with a space between two consecutive confinement zones equal to the same order of magnitude.

Part of the second face of the first portion 210 is in contact with the second portion 220 of the second region.

Figure 1B:
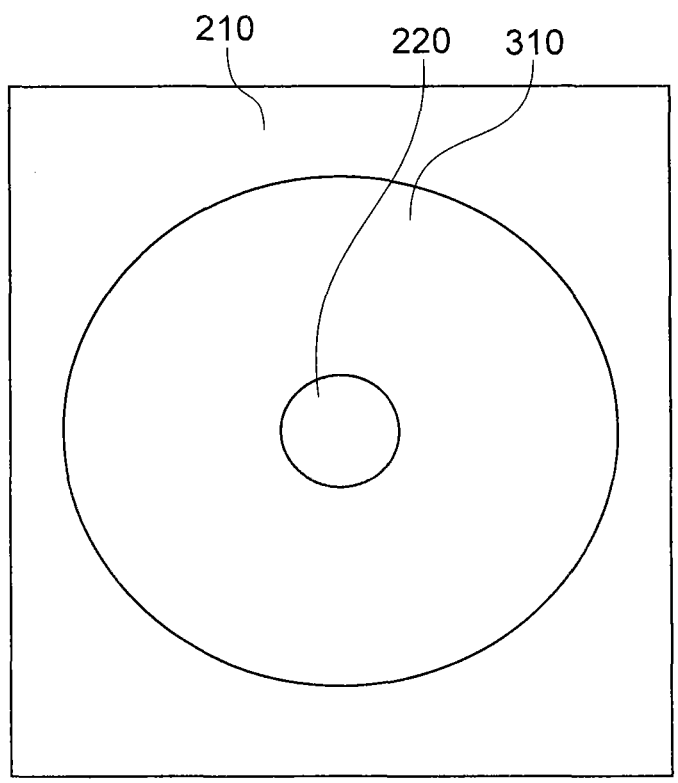

The second portion 220 of the second region 20 as shown in FIGS. 1a and 1b is in the form of a cylindrical pad, the second face of the base of the pad being in contact with the first portion 210. The second portion 220 is made from a preferably direct band gap semiconducting material. The second portion 220 has a second type of conductivity opposite the first type of conductivity. According to the operating principle of this first embodiment, the lateral dimensions of the second portion 220 may be small relative to the dimensions of the first portion 210.

In the particular application, the second portion 220 of the second region is made from gallium nitride GaN. The second portion 220 has the second type of conductivity that is opposite the first type of conductivity, in other words the type of conductivity for which majority carriers are holes.

The part of the second face of the first portion 210 that is not covered by the second portion 220 is in contact with the polarisation gate 310. In such a configuration, the polarisation gate is closer to the second portion 220 than the first region 10.

In this way, the second portion 220 of the second region 20 and the polarisation gate 310 are located in a complementary manner on the second face of the first portion 210.

The polarisation gate 310 comprises an insulating layer 311 and a conducting layer 312.

The insulating layer 311 covers the part of the second face of the first portion 210 that is not covered by the second portion 220. The insulating layer 311 is made from an electrically insulating material such as silicon dioxide $SiO_2$, hafnium dioxide $HfO_2$ or another material with high dielectric constant (known as a "high k" material). The thickness of the insulating layer 311 is between 1 to 10 nm so as to electrically isolate the conducting layer 312 from the first portion 210.

In the particular application, the insulating layer 311 is made from hafnium dioxide $HfO_2$.

The conducting layer 312 covers the insulating layer 311 such that polarisation of this insulating layer modifies the distribution of carriers with the second type of conductivity in the first portion 210 so that carriers with the second type of conductivity are accumulated or depleted in the first portion.

The conducting layer 312 is preferably adapted to be transparent to light emitted by the structure 1 so as to allow the light to escape from the structure 1 after it has been emitted. Thus according to this possibility, the conducting layer may be made from indium and tin oxide (ITO) as is the case in the particular application.

The support 100 and the second portion 220 are both provided with an adapted electrical contact 410, 420 respectively, to form a light emitting diode. The electrical contacts 410, 420 are both adapted to form a resistive contact with the region 10 and/or portion 220 on which it is installed.

Thus, in the particular application, the first contact 410 that is in contact with the support 100 is adapted to form a resistive contact with a gallium nitride GaN for which the type of conductivity is the type for which the majority carriers are electrons, while the second contact 420 that is in contact with the second portion 220 of the second region 20 is adapted to form a resistive contact with a gallium nitride GaN for which the type of conductivity is the type for which the majority carriers are holes.

FIGS. 1c to 1e and FIGS. 2a to 2d illustrate the operating principle of such a structure when it is according to the particular application.

Figure 1C:
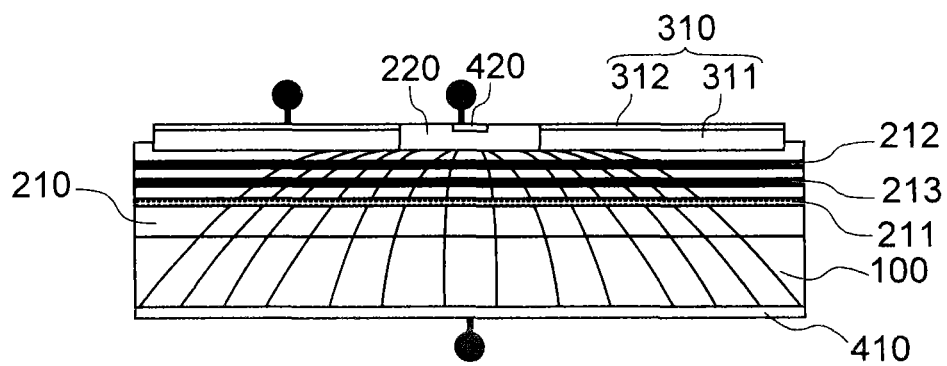
Figure 1D:
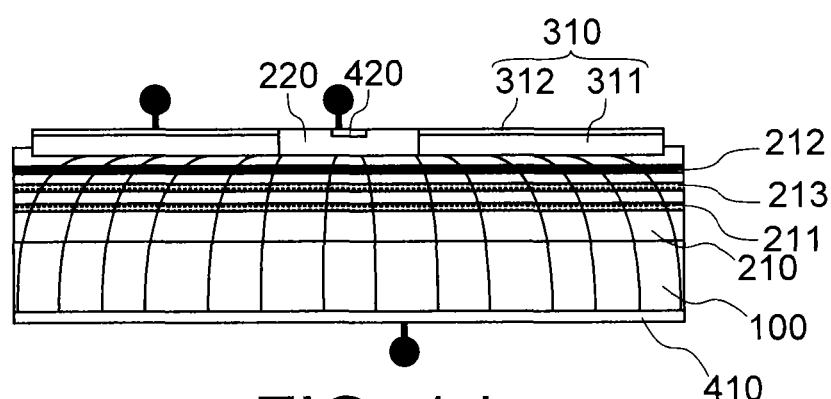
Figure 1E:
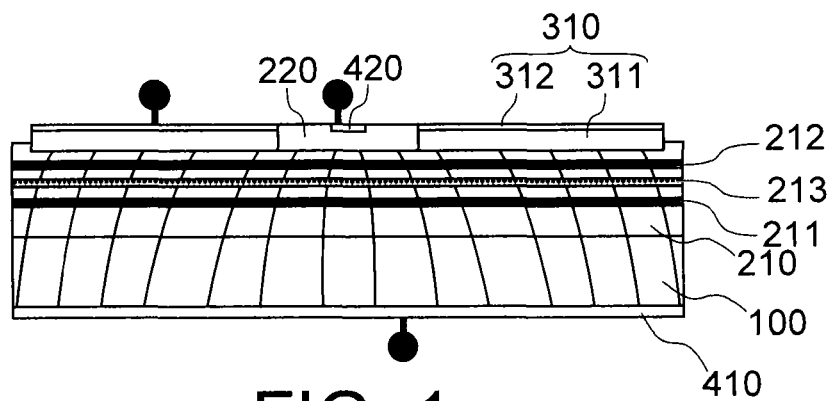

Thus, FIG. 1c shows operation of the structure when no polarisation voltage is applied to the first polarisation gate 310. In this configuration, while the diode formed by the first and second regions 10, 20 is positively polarised, the first polarisation gate 310 does not affect the first portion 210 of the second region 20 when no polarisation is applied to it. Therefore, this is the same configuration as for a diode according to prior art, and emission takes place mainly in the first confinement zone 211. When the first polarisation gate 310 is polarised negatively relative to the voltage applied to the second contact 420, the polarisation voltage of the first polarisation gate 310 modifies the distribution of current lines by spreading the current lines. This modification to the distribution of current lines modifies the distribution of majority carriers with the second type of conductivity by creating an accumulation of these carriers as shown in FIGS. 1d and 1e.

Thus, if no voltage is applied to the first polarisation gate 310, the distribution of current lines is conducive to radiative recombinations in the first confinement zone 211. When a negative voltage is applied to the first polarisation gate 310, the resulting spreading of current lines increases the volume of the third confinement zone 213 in which electron-hole pair recombinations take place, so that as shown in FIG. 1d, firstly emission in the first and the third confinement zones 211, 213 is equalised, and secondly emission in the third confinement zone 213 becomes predominant at higher negative voltages.

Figure 2:
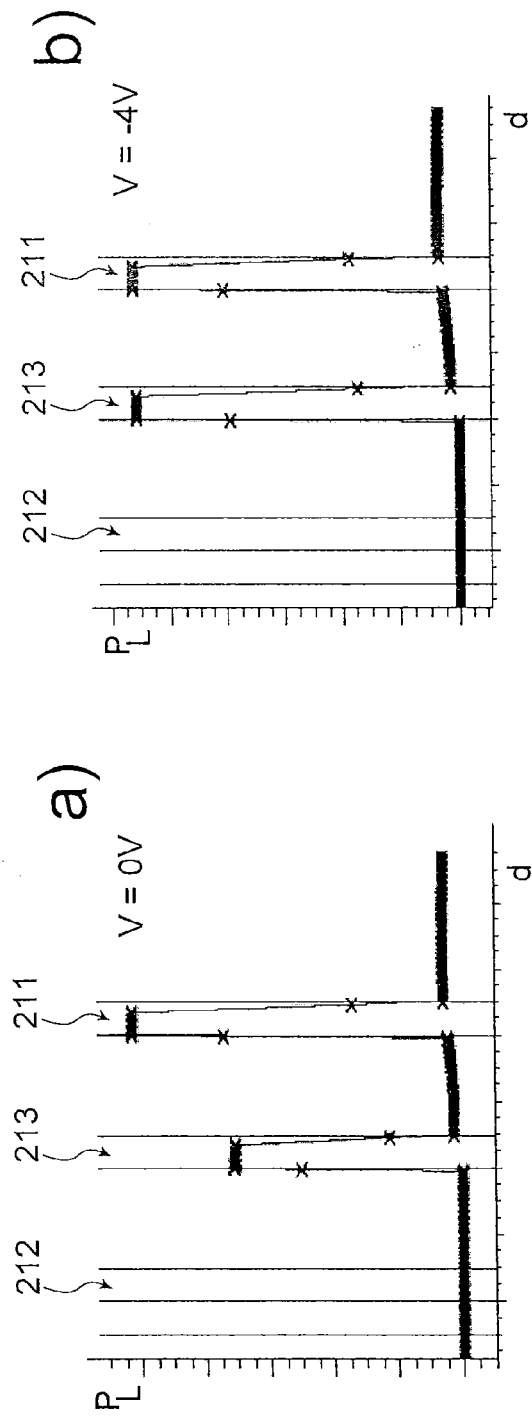
FIGS. 2a to 2d illustrate the variation in emitted power $P_L$, in each of the confinement zones of the structure shown in FIG. 1, for four polarisation values of the first polarisation means.
Figure 2:
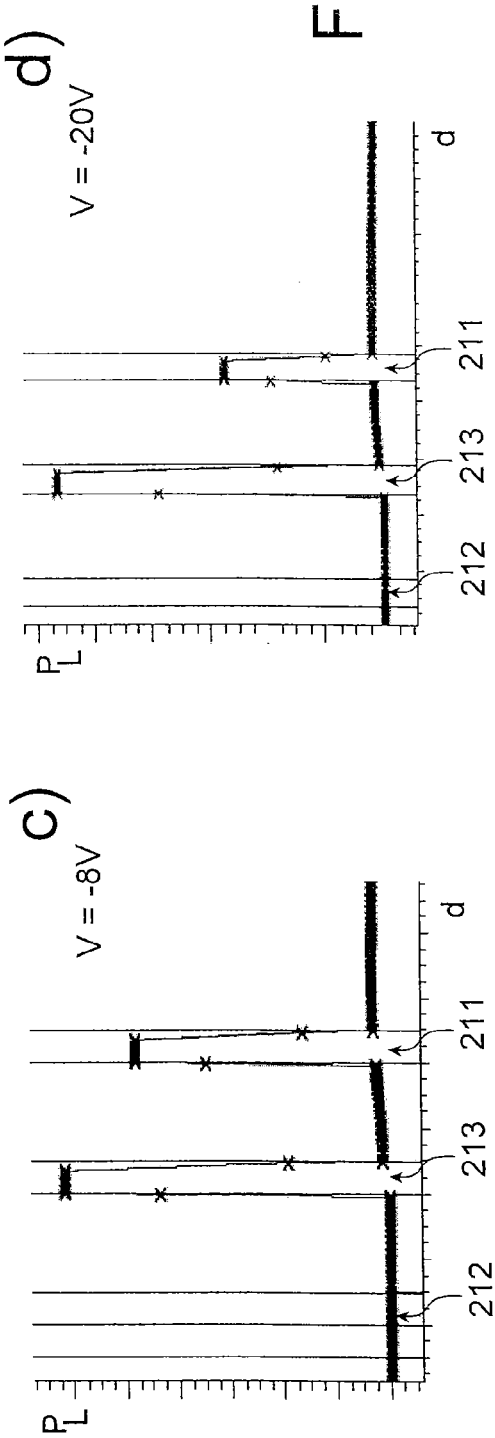

The simulations graphically illustrated in FIGS. 2a to 2d, show this phenomenon by illustrating the variation in the emitted light power $P_L$ along the height d of the structure 1. It can be seen that for a polarisation of 0 V applied to the first polarisation gate 310, about 60% of the emitted light power $P_L$ is emitted from the first zone 211. When the polarisation voltage of the first polarisation gate 310 is set to −4 V, as shown in FIG. 2b, the emitted power is distributed approximately equally between the first confinement zone 211 and the third confinement zone 213.

Emission becomes predominant in the third confinement zone to reach about 66% of the emitted light power for a voltage of the first polarisation gate 310 equal to −20 V.

Thus, according to the particular application, the emission light changes from tending towards the yellow to tending towards the green.

A method of manufacturing a structure 1 according to this first embodiment and the particular application may include the following steps:

supply of a semiconducting support 100 with the first type of conductivity for which the majority carriers are electrons, said support 100 being made from gallium nitride GaN, formation of the first portion 210 of the second region 20 by depositing a layer of gallium nitride GaN with the first type of conductivity, this formation of indium In being added to gallium nitride GaN so as to form the confinement zones 211, 212, 213, formation of a layer of gallium nitride GaN in contact with the first portion 210 of the second region 20, etching of part of the layer of gallium nitride so as to leave a single cylindrical pad on the surface of the first portion 210 and thus form the second portion 220 of the second region 20 and therefore the second region 20 with the first portion 210, formation of a layer of hafnium dioxide $HfO_2$ on the surface of the first portion 210 of the second region 20 that is not covered by the second portion 220 so as to form the insulating layer 311, formation of a conducting layer 312 in contact with the insulating layer 311, said conducting layer 312 being made from indium and tin oxide, said conducting layer 312 forming the first polarisation gate 310 with the insulating layer 311, formation of the first and second electrical contacts 410, 420 in contact with the support 100 and the second portion 220 of the second region 20 respectively.

According to another possibility of the invention, the method of manufacturing a structure 1 according to this first embodiment may comprise the following three steps, instead of the two steps for manufacturing the second portion 220 of the second region 20 consisting of forming a layer of gallium nitride GaN and etching part of it so as to form a pad:

formation of a mask leaving free only the part of the second face of the first portion 210 that will come into contact with the second portion 220 of the second region 20, formation of the second portion 220 by selectively depositing gallium nitride GaN in contact with the part of the second face of the first portion 210 of the second region 20 that is not protected by the mask, elimination of the mask.

Such structures 1 can be fitted on a semiconducting device, not shown, such that this semiconducting device forms an information display device such as a screen. In such a device, the structures 1 according to the invention in which emission may be modulated independently of each other, can be organised in rows and columns.

Figure 3:
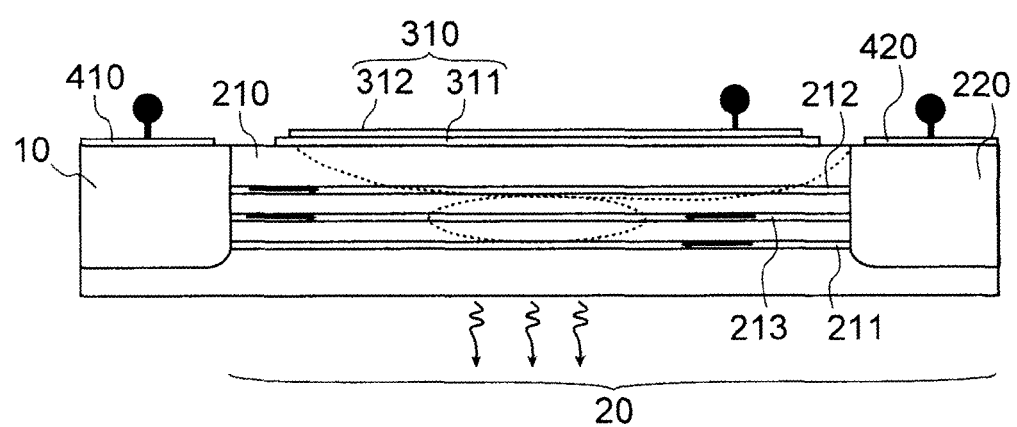
FIG. 3 shows a structure according to a second embodiment in which there are three confinement zones adapted to emit at three different wavelengths and in which the confinement zone(s) in which the emission takes place are selected by means of a first polarisation means.

FIG. 3 shows a structure 1 according to a second embodiment in which the structure 1 is a plane type structure.

A structure 1 according to this second embodiment is different from a structure 1 according to the first embodiment in that the first and second regions 10, 20 are in a single layer called the active layer in contact with or without support 100, therefore this support, when the structure 1 has a support does not form the first region.

It should be noted that in this second embodiment, the first and second types of conductivity of a structure 1 according to the particular application are inverted from the types of conductivity of a structure according to the first embodiment, when it is according to the particular application. Thus, in this second embodiment and according to the particular application, the first type of conductivity is the type for which the majority carriers are holes, the second type of conductivity being the type for which the majority carriers are electrons.

The support 100 according to this second embodiment and when the structure 1 has a support, is different from a support 100 according to the first embodiment in that it can be made from a material other than a semiconducting material, for example such as sapphire $Al_2O_3$, and in that it is not necessarily with the first type of conductivity, since its conducting properties are not used for operation of the structure 1. According to the possibility shown in FIG. 3, the structure 1 does not have a support 100.

In the particular application, the structure 1 has no support 100 and the first portion 210 of the second region 20 is made from gallium nitride GaN of the non-intentionally doped type.

In this second embodiment, the first region 10 and the second portion 220 of the second region 20 are both lateral parts of the active layer and the first portion 210 of the second region is a central part of this active layer. The first portion 210 forms the interface between the first region 10 and the second portion 220 of the second region 20.

The first portion 210 extends longitudinally along the layer plane of the active layer and comprises a first and a second longitudinal face. In this second embodiment, the first, second and third confinement zones 211, 212, 213 all lie in the layer plane. The first confinement zone 211 is facing the first face while the second confinement zone 212 is facing the second face of the first portion 210. The third confinement zone 213 is located between the first and the second confinement zones 211, 212.

In this second embodiment, the first polarisation gate 310 formed by the insulating layer 311 and the conducting layer 312, covers the second face of the first portion 210 of the second region 20. The first and second electrical contacts 410, 420 are present on a single face of the active layer that is the face on which the first region 10 and the second portion 220 of the second region 20 are exposed. With such an arrangement of the first polarisation gate 310, this gate is close to the first region 10 and the second portion 220 of the second region 20. Thus, the first polarisation gate is at approximately at equal distances from the first region 10 and the second portion 220.

According to the particular application, the first and the second contacts 410, 420 are suitable to form a resistive contact with the first region 10 and the second portion 220 of the second region 20 respectively.

The operating principle of a structure 1 according to this second embodiment is different from the operating principle of a structure 1 according to the first embodiment in that application of a polarisation voltage affects the distribution of carriers with the first and second types of conductivity with an accumulation of electrons for a positive voltage and an accumulation of holes for a negative voltage. Thus, with such an electrode, it is possible to modify the current lines and therefore the distribution of emission between the different confinement zones 211, 212, 213.

Figure 4:
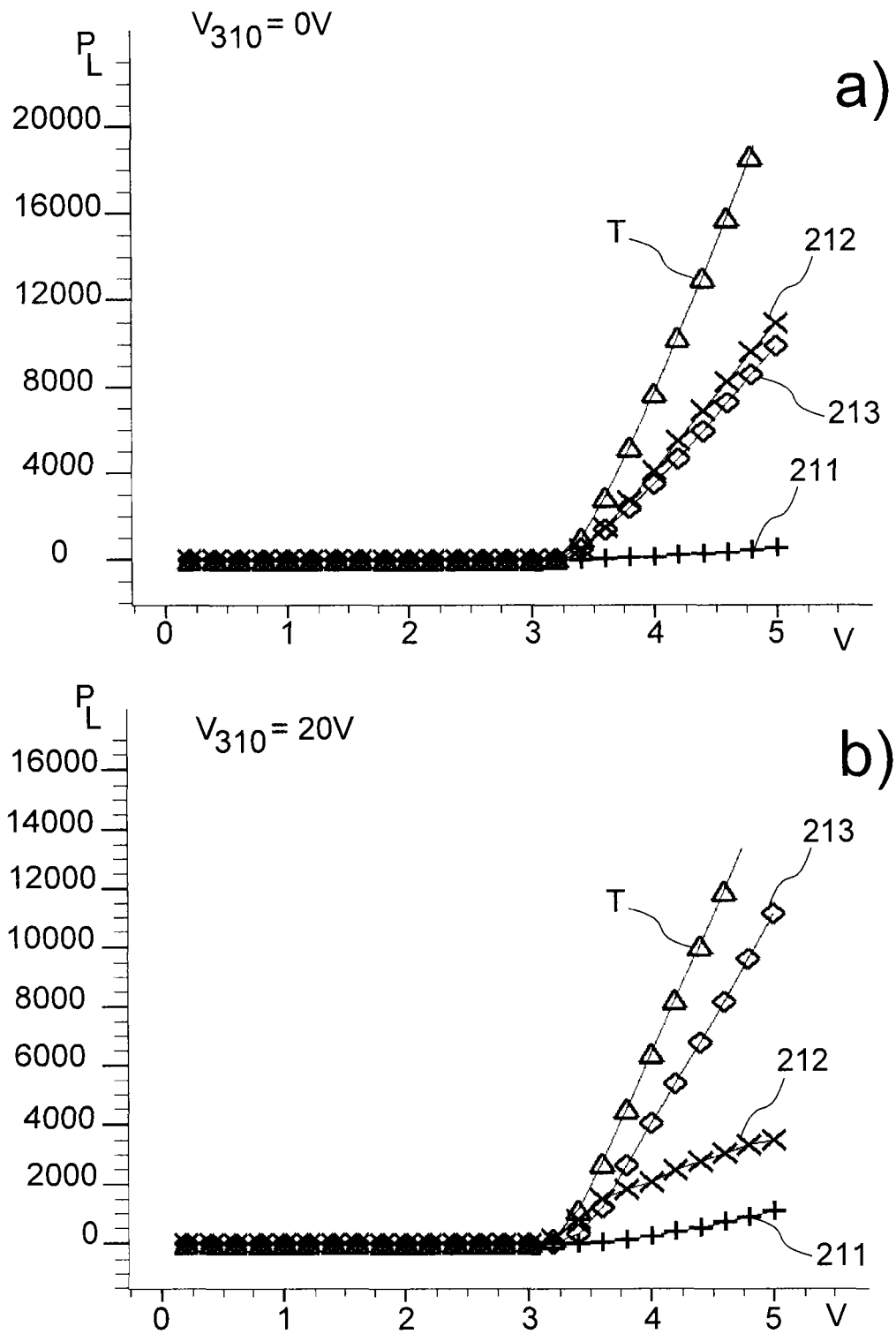
FIGS. 4a and 4b illustrate the variation in emitted power $P_L$, in each of the confinement zones of the structure shown in FIG. 3 for two polarisation values of the first polarisation means.

This phenomenon is shown in the simulation results illustrated in FIGS. 4a and 4b. In FIG. 4a, it can be seen that for a polarisation of 0 V applied to the first polarisation gate 310, the emitted light power is similar in the second and third confinement zones 211, 212. When the polarisation voltage of the first polarisation gate 310 is set to 20 V as shown in FIG. 4b, the principal origin of the emitted power is the third confinement zone 213, the proportion of light power emitted by the first and the second confinement zones 211, 212 accounting for less than 33% of the total of the emitted light power T. A positive polarisation voltage of the first polarisation gate 310 relative to the first region 10 and to the second portion 220 of the first region 20 causes an accumulation of electrons. The result is partial inhibition of light emission in the second confinement zone 212, emission becoming predominant in the third confinement zone 213.

It should be noted that as a variant, a negative polarisation of the first polarisation gate 310 creates an accumulation of holes in the second confinement zone 212 leading to effects similar to those described above.

Figure 5A:
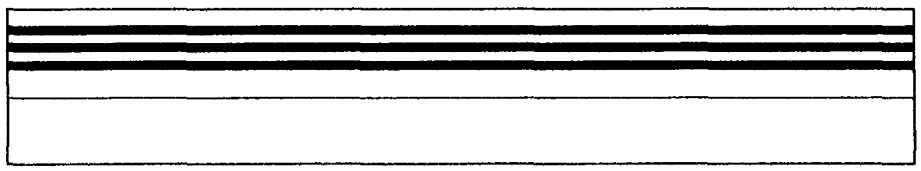
FIGS. 5a to 5d illustrate a method of manufacturing a structure as shown in FIG. 3, FIGS. 6a and 6d illustrate a method of manufacturing a structure according to one possible variant of the second embodiment, FIGS. 7a and 7b each illustrate a structure according to a third embodiment in which a second polarisation means is also provided to fine tune the selection of the confinement zone(s) in which emission mainly takes place, the first and the second polarisation means being located on opposite faces of the structure in FIG. 7a and on the same face of the structure in FIG. 7b, FIGS. 8a and 8b illustrate the variation of emitted power $P_L$, in each confinement zone of the structure shown in FIG. 7a for two polarisation values of the first and the second polarisation means.
Figure 5B:
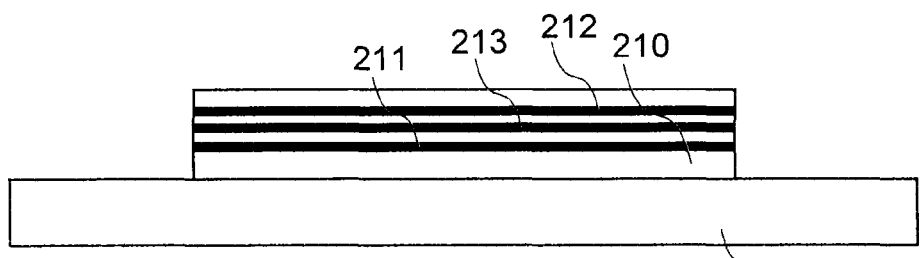
Figure 5C:
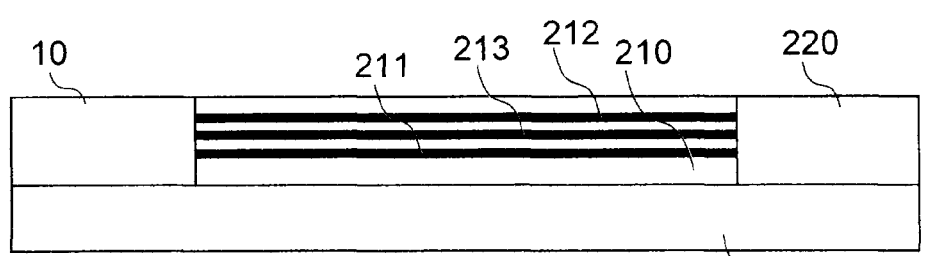
Figure 5D:
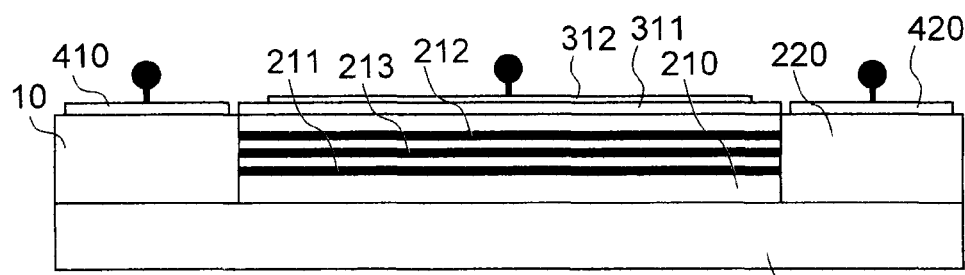

FIGS. 5a to 5c illustrate the principal steps in a method of manufacturing a structure 1 according to this second embodiment. Such a manufacturing method in the case of a method of manufacturing a structure 1 according to the particular application, comprises the following steps:

as shown in FIG. 5a, supply of a non-intentionally doped type layer of gallium nitride GaN, indium In having been added to the gallium nitride during formation of the layer so as to form the first, second and third confinement zones 211, 212, 213, as shown in FIG. 5b, etching of part of the layer of Gallium nitride GaN to expose two lateral parts of said layer corresponding to the first region 10 and the second portion 220 of the second region 20 respectively, said etching step defining the first portion 210 of the second region 20, formation of a zone of gallium nitride GaN with the first type of conductivity in one of the parts exposed during the etching step so as to form the first region 10, formation of a zone of gallium nitride GaN with the second type of conductivity in the part of the two lateral parts exposed during the etching step on which the first region 10 was not formed, so as to form the second portion 220 of the second region 20, the active layer and the second region 20 being formed in the latter step as shown in FIG. 5c, formation of the insulating layer 311 in contact with the first portion 210 of the second region 20, formation of the conducting layer 312 in contact with the insulating layer 311 so as to form the first polarisation gate 310, formation of the first and the second electrical contacts 410, 420 in contact with the first region 10 and the second portion 220 of the second region 20 respectively, as shown in FIG. 5d.

FIGS. 6a to 6d illustrate a method of manufacturing a structure 1 according to a variant of the second embodiment.

Figure 6A:
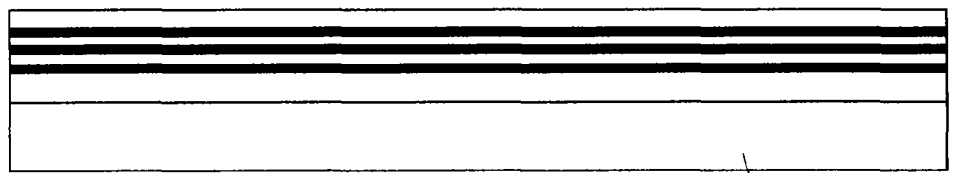
Figure 6B:
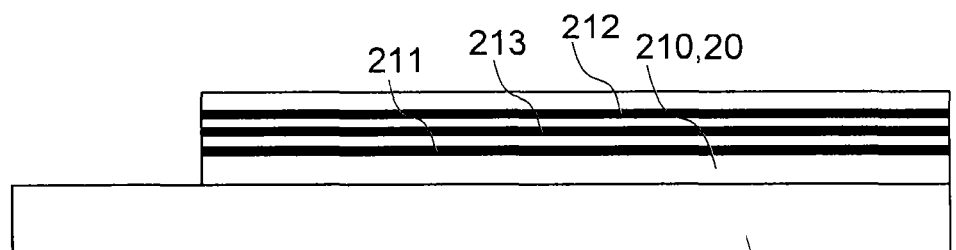
Figure 6C:
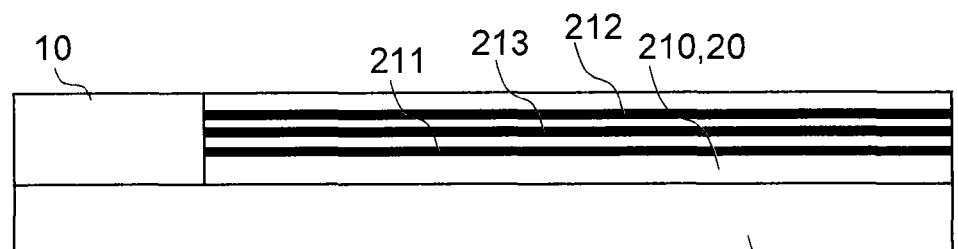
Figure 6D:
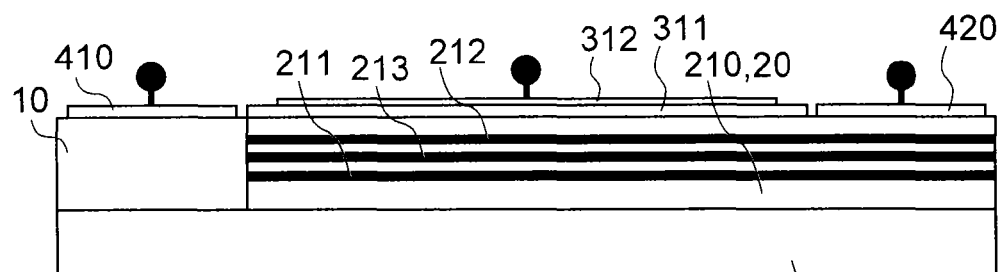

A structure 1 according to this variant of the second embodiment is different from the structure according to the second embodiment described above in that the second region 20 only comprises the first portion 210, as shown in FIG. 6d, this first portion having the second type of conductivity.

Thus according to this variant, the first portion 210 has the second type of conductivity such that it forms a portion of the second region 20 with the second type of conductivity.

Thus, in the particular application, the first portion 210 is made from a gallium nitride GaN with the second type of conductivity, in other words the type of conductivity for which the majority carriers are holes. The concentration of majority carriers for the first portion 210 may be $10^{18}$ cm$^{-3}$.

The first portion 210 opposite the first region 10 is fitted with the second electrical contact 420.

The operating principle of a structure 1 according to this variant of the second embodiment is identical to the operating principle of a structure 1 according to the second embodiment already described, except that when the first polarisation gate 310 is polarised so as to create an accumulation with the second type of conductivity, the majority carriers are derived from this first portion 210.

A method of manufacturing a structure 1 according to this variant of the second embodiment as shown in FIGS. 6a to 6d is different from the manufacturing method according to the second embodiment described above in that during the formation of the layer of non-intentionally doped gallium nitride GaN, this layer is made from gallium nitride GaN with the second type of conductivity, in that, as shown in FIG. 6b, during the etching step, only a lateral part of the layer of gallium nitride GaN is etched corresponding to the first region 10, and in that there is no step in which the second portion 220 of the second region 20 is formed, since the structure 1 does not have one.

It should also be noted that as shown in FIG. 6d, during the step in which the electrical contacts 410, 420 are formed, the second electrical contact 420 is formed in contact with the first portion 210 of the second region 20 on a lateral part of this second region, the first polarisation gate 310 thus being in a central position between the two electrical contacts 410, 420.

Figure 7A:
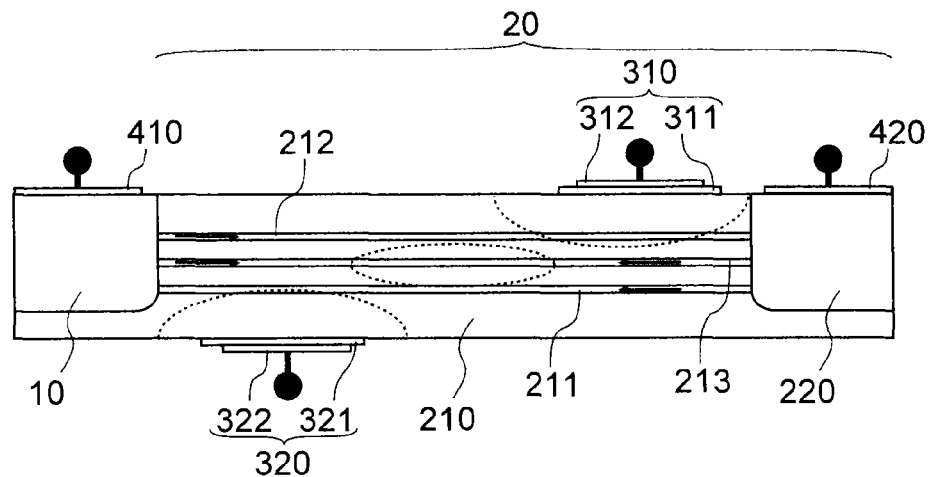

FIG. 7a shows a structure 1 according to a third embodiment of the invention in which there is a second polarisation gate 320. A structure 1 according to this third embodiment is different from a structure according to the second embodiment in that it also comprises a second polarisation gate 320. This second polarisation gate 320 is adapted so that polarisation of this gate will modify the distribution of carriers with the first type of conductivity.

Majority carriers with the first type of conductivity in the first portion 210 accumulate from the first region 10.

In the same way as for the second embodiment and as shown in FIG. 7, a structure 1 according to this third embodiment does not have a support 100, the first portion 210 of the second region 20 forming the major part of the structure 1.

In this third embodiment, the first polarisation gate 310 is in contact with the first portion 210 of the second region close to the second portion 220 of the second region 20. The second polarisation gate 320 is in contact with the first portion 210 close to the first region. The second polarisation gate 320 is located on the face of the first portion 210 opposite the first polarisation gate 310.

The configuration of the second polarisation gate 320 is similar to the configuration of the first polarisation gate 310. Thus, the second polarisation gate 320 comprises an insulating layer 321 in contact with the first portion 210 and a conducting layer 322 in contact with the insulating layer 321.

The second polarisation gate 320 forms a polarisation means located to polarise the first portion 210 and so that polarisation of the second polarisation gate 320 modifies the distribution of majority carriers with the first type of conductivity in the first portion 210.

The operating principle of a structure 1 according to this third embodiment is to use the first and second polarisation gates 310, 320 to modify the distribution of carriers of the second and first types of conductivity respectively. Thus in this third embodiment, the first polarisation gate 310 modifies the distribution of carriers with the second type of conductivity when a voltage is applied, and generates either a depletion zone or an accumulation zone of carriers with the second type conductivity in the first portion 210. In the same way, the second polarisation gate 320 modifies the distribution of carriers with the first type of conductivity and generates either a depletion zone or an accumulation zone of carriers with the first type of conductivity in the first portion 210. Therefore, by modulating the polarisation of the first and second polarisation gates 310, 320, it is possible to modulate the distribution of carriers of the first and second types of conductivity, and therefore the distribution of current lines between the first, second and third confinement zones 211, 212, 213. Such a modification modulates the emission between the first, second and third confinement zones 211, 212, 213.

Figure 8:
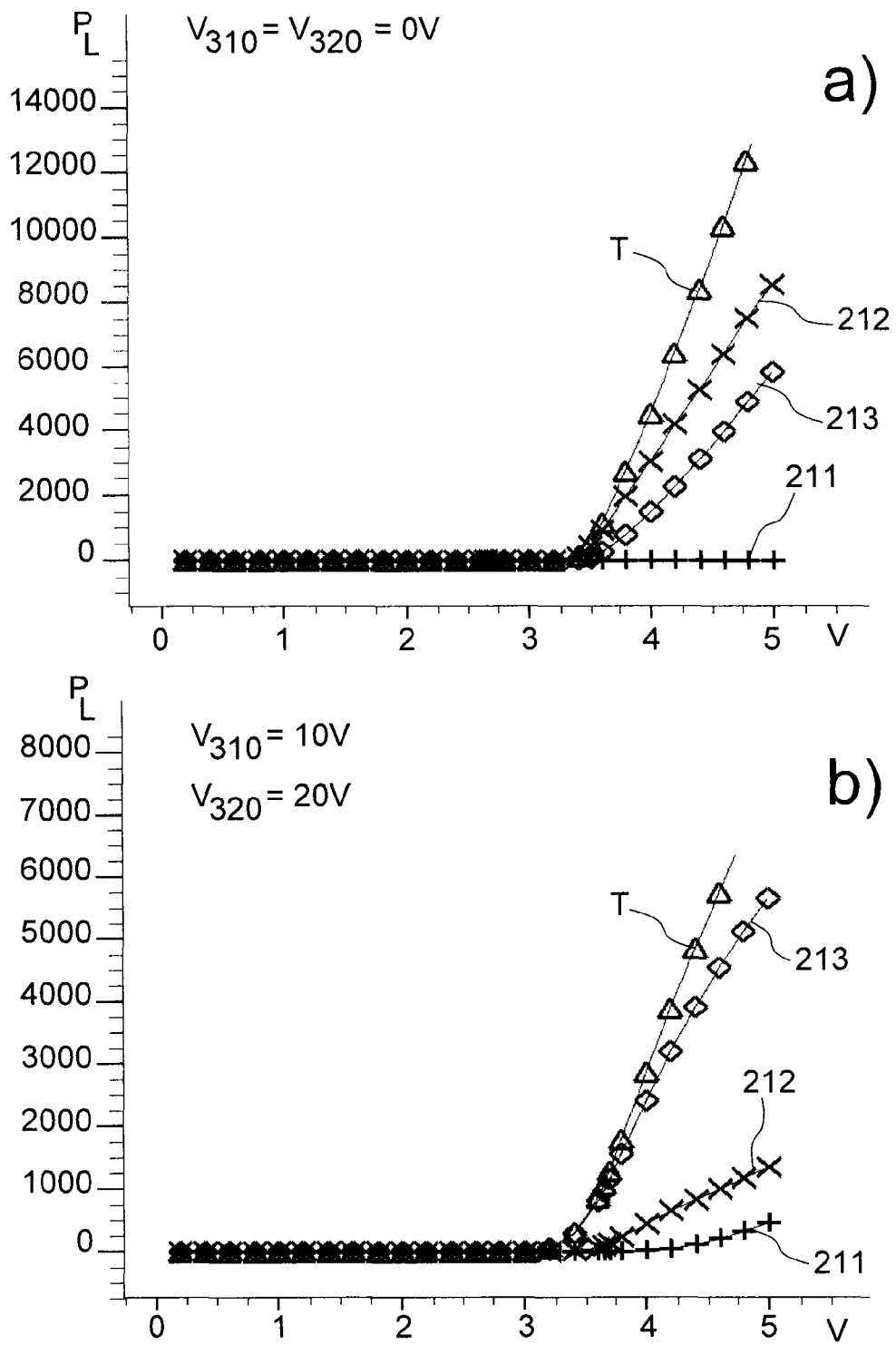

Simulations of such a structure 1, for which the graphs are shown in FIGS. 8a to 8b, illustrate this principle for a structure 1 according to the particular application. When no polarisation is applied to the polarisation gates 310, 320, as illustrated in FIG. 8a, the light power is output in both the second and third confinement zones 212, 213. These two confinement zones comprise the narrowest band gap, such that these two confinement zones are the most conducive to passage of current between the first region 10 and the second portion 220.

For a voltage of 10 V applied to the first polarisation gate 310 and a voltage of 20 V applied to the second polarisation gate 320, the light power is emitted mainly in the third confinement zone 213 that accounts for about 70% of the total emitted power, the power emitted in the first and the second confinement zones 211, 212 corresponding to about 10% and 20% respectively of the total emitted power.

In this configuration, the voltage of 10V applied to the first polarisation gate 310 makes it possible to generate a depletion zone for the carriers with the first type of conductivity, in other words holes, close to this gate and therefore in the second confinement zone. Therefore such a depletion zone reduces the total number of electron-hole pairs recombinations that take place in the second confinement zone 212. The voltage of 20 V applied to the second polarisation gate 320 generates an accumulation with the second type of carrier, in other words electrons, close to the polarisation gate and therefore in the first confinement zone 211 and partly in the third confinement zone 213. Such a contribution of electrons in the third confinement zone 213 increases the probability of meetings between electrons and holes and electron-hole pair recombinations. This results in an increase in the light power emitted in the third confinement zone 213. To a lesser extent, this accumulation also increases the emitted power in the first confinement zone 210.

Figure 7B:
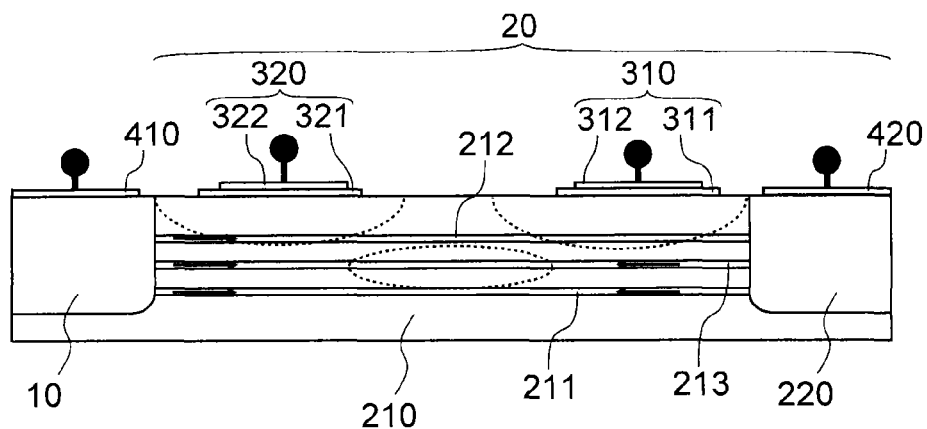

The FIG. 7b shows a structure according to a second variant embodiment of a structure according to the third embodiment in which the second polarisation gate 320 is located on the same face as the face on which the first polarisation gate 310 is located. In this variant, the second polarisation gate is also close to the first region 10.

The operating principle is identical to that for structure 1 according to the second embodiment described above, except that the polarisation voltage of the second polarisation gate 320 must be inverted if the same effects are to be obtained. In this second embodiment, the second polarisation gate 320 is located close to the second confinement zone, and therefore an electron depletion zone has to be created in the second confinement zone 212, in order to create an electron accumulation zone in the first confinement zone. Therefore, the results shown in FIG. 8b may be obtained in such a structure by application of a positive voltage on the first polarisation gate 310 and a negative voltage on the second polarisation gate 320.

Figure 9A:
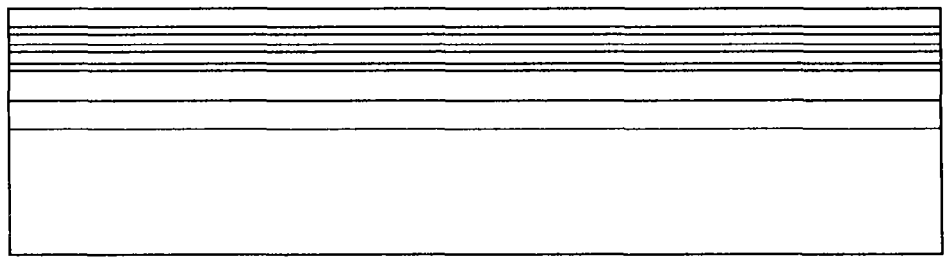
FIGS. 9a to 9e illustrate a method of manufacturing a structure according to one possible variant of the third embodiment.
Figure 9B:
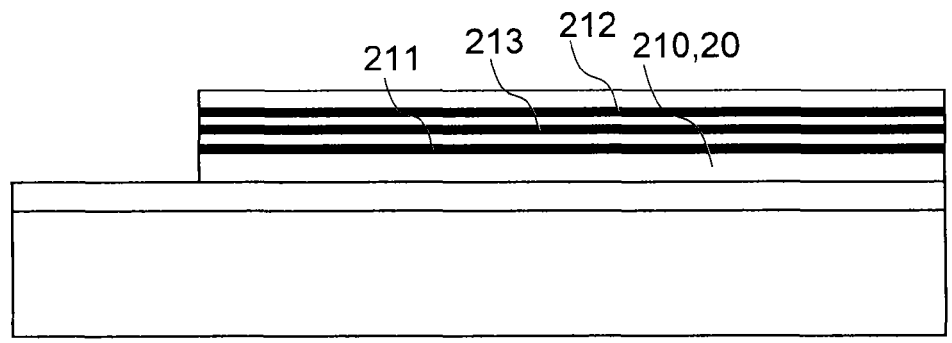
Figure 9C:
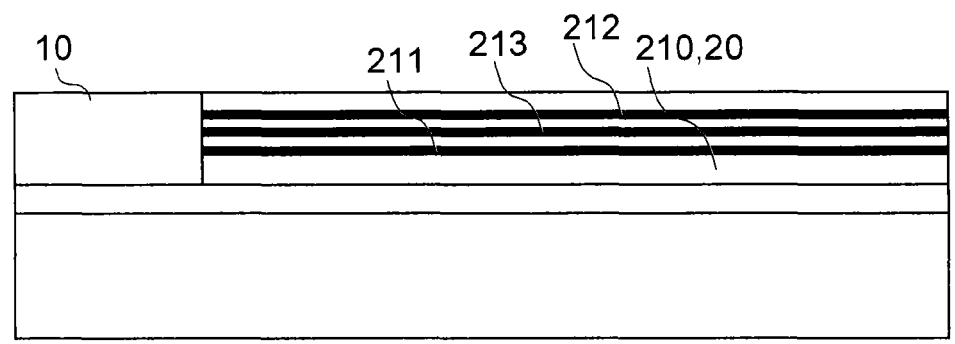
Figure 9D:
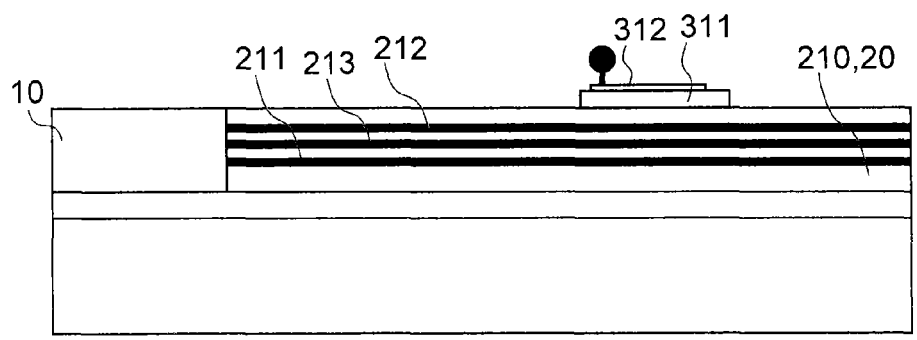
Figure 9E:
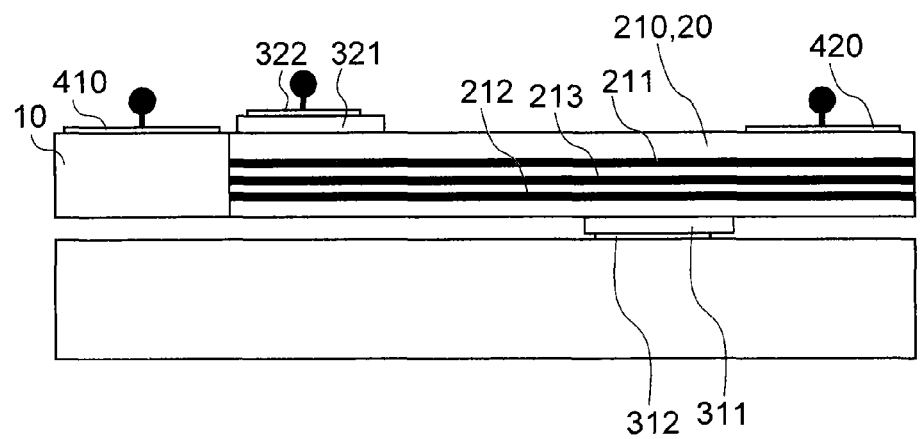

FIGS. 9a to 9e show a method of manufacturing a structure according to this third embodiment in the variant shown in FIG. 7a using a possibility of the invention in which the second region 20 does not comprise a second portion 220, the first portion 210 having the second type of conductivity. According to this possibility, as shown in FIG. 9e, the structure 1 is in contact with a conducting substrate due to the first polarisation gate 310.

Such a manufacturing method comprises the following steps:
supply of a first support suitable for the formation of a layer of gallium nitride GaN and comprising a sacrificial layer on which the layer of gallium nitride GaN is formed,
as shown in FIG. 9a, formation of a layer of gallium nitride GaN with the second type of conductivity in contact with the sacrificial layer, indium In being added into the gallium nitride GaN during formation of the layer so as to form the first, second and third confinement zones 211, 212, 213,
as shown in FIG. 9b, etching of part of the layer of gallium nitride GaN so as to expose a lateral portion of said layer corresponding to the first region 10,
as shown in FIG. 9c, formation of a zone of gallium nitride GaN with the first type of conductivity on the part exposed during the etching step so as to form the first region 10,
formation of an insulating layer 311 in contact with the second region 20, said insulating layer 311 will form the first polarisation gate 310,
as shown in FIG. 9d, formation of a conducting layer 312 in contact with the insulating layer 311 that will form the first polarisation gate 310 so as to form the first polarisation gate 310,
separation of the layer formed by the first and the second regions 10, 20 of the first support by selective etching of the sacrificial layer,
transfer of the layer formed by the first and the second regions 10, 20 onto a conducting substrate, said layer being brought into contact with the second substrate by means of the first polarisation gate 310,
formation of an insulating layer 321 in contact with the second region 20, said insulating layer 321 will be used to form the second polarisation gate 320,
formation of a conducting layer 322 in contact with the insulating layer 321 that will be used to form the second polarisation gate 320, so as to form the second polarisation gate 320,
formation of the first and second electrical contacts 410, 420 in contact with the first region 10 and the second portion 210 of the second region 20 respectively, as shown in FIG. 9e.

It should be noted that although the confinement zones 211, 212, 213 in the embodiments described above are formed by quantum wells, the structure may comprise another type of confinement zone different from quantum wells, for example such as zones in which quantum boxes or quantum wires are located, without going outside the scope of the invention.

Although the structure 1 described in the embodiments described above comprises three confinement zones 211, 212, 213, it would also be possible for the structure 1 to comprise only two confinement zones or more than three confinement zones without going outside the scope of the invention.

Furthermore, although the first polarisation gate 310 in the different embodiments described is adapted so that polarisation of this gate causes a modification to the distribution of majority carriers with the second type of conductivity in the first portion 210, such a characteristic does not prevent the first polarisation gate 310 from being adapted so that a second polarisation of this gate will cause a modification to the distribution of majority carriers with the first type of conductivity in the first portion 210. It should be noted that in general, the appropriate second polarisation when the arrangement of the first polarisation gate enables such a possibility, is the reverse of the first appropriate polarisation. This comment is also applicable to the second gate when the structure comprises a second gate. Obviously, these two possibilities remain within the scope of the invention because they enable a modification to the distribution of carriers of at least one type of conductivity among the first and second types of conductivity and a modification to the distribution of current lines.

Although the first and second polarisation means consist of polarisation gates in all the embodiments and variant embodiments described above, without going outside the scope of the invention, the structure according to the invention may also comprise another means such as a Schottky contact, adapted to apply an external electrical field to the first portion, provided that this Schottky contact is adapted to apply an external polarisation to the first portion without injection of carriers by this polarisation means.

Similarly, although in the embodiments and variant embodiments described above, each of the first and second polarisation means is close to either the first region or the second portion, without going outside the scope of the invention, it would also be possible to envisage that at least one of the first and the second polarisation means is located at a distance from the first region and the second portion. Although proximity can modify the distribution of carriers of a given type of conductivity, this proximity is not necessary to obtain a field effect that modifies the distribution of carriers of at least one type of conductivity.

The invention claimed is:

1. A semiconducting structure intended to emit light, comprising:
a first semiconducting region with a first type of conductivity,
a second semiconducting region comprising at least a first portion, wherein the second semiconducting region comprises at least a portion of the second type of conductivity which is either the first portion itself or a second portion of the second semiconducting region, so as to form a semiconducting junction with the first semiconducting region, the first portion being in contact with the first semiconducting region, wherein the first portion extends at least partially along the semiconducting junction, this first portion comprising at least a first and a second carrier confinement zone for at least one type of carrier, wherein the semiconducting structure comprises at least a first means of polarisation of the first portion adapted to apply direct first external polarisation to the first portion in order to modify the distribution of carriers of at least one type of conductivity in the first portion relative to the first and the second confinement zones and to select the confinement zone(s) in which light emission takes place, the first and second confinement zones having different band gap widths.

2. The semiconducting structure according to claim 1, wherein the portion with the second type of conductivity is a second portion of the second semiconducting region distinct from the first portion.

3. The semiconducting structure according to claim 1, wherein the first portion is the portion with the second type of conductivity in the second region.

4. The semiconducting structure according to claim 1, wherein the first polarisation means is located close to one among the second portion and the first semiconducting region relative to the other among the second portion and the first semiconducting region such that polarisation of the latter modifies the distribution in the first portion of carriers among carriers with the second type of conductivity and the first type of conductivity, respectively.

5. The semiconducting structure according to claim 1, wherein the first polarisation means is located at approximately equal distances from the second portion and the first semiconducting region such that polarisation of the latter modifies the distribution of carriers with the first and second types of conductivity in the first portion.

6. The semiconducting structure according to claim 1, wherein a second polarisation means adapted to apply direct second external polarisation to the first portion is also provided, to modify the distribution of carriers of at least one type of conductivity in the first portion relative to the first and the second confinement zones.

7. The semiconducting structure according to claim 4, wherein a second polarisation means adapted to apply direct second external polarisation to the first portion is also provided, to modify the distribution of carriers of at least one type of conductivity in the first portion relative to the first and the second confinement zones and wherein the second polarisation means is located close to the other among the second portion and the first semiconducting region relative to the first polarisation means such that polarisation of this second polarisation means modifies the distribution in the first portion of carriers among the carriers of the first and second types of conductivity respectively.

8. The structure according to claim 2, wherein the first portion is a layer extending along a layer plane and comprising first and a second face, the first and second confinement zones extending along the layer plane approximately parallel to each other, and wherein the second portion of the second semiconducting region and the first polarisation means are located in a complementary manner on the second face of the first portion.

9. The semiconducting structure according to claim 1, wherein the first portion of the second semiconducting region extends along a layer plane longitudinally from the first semiconducting region, the first portion having a first and a second longitudinal face, the first and the second confinement zones extending along the layer plane facing the first and the second face of the first portion respectively, the first polarisation means being located on the second face of the first portion.

10. The semiconducting structure according to claim 2, wherein the first portion of the second semiconducting region extends along a layer plane longitudinally from the first semiconducting region, the first portion having a first and a second longitudinal face, the first and the second confinement zones extending along the layer plane facing the first and the second face of the first portion respectively, the first polarisation means being located on the second face of the first portion and wherein the second portion of the second semiconducting region is in contact with the first portion approximately opposite the first semiconducting region, the first and the second semiconducting regions being arranged to form a layer.

11. The semiconducting structure according to claim 7, wherein the first portion of the second semiconducting region extends along a layer plane longitudinally from the first semiconducting region, the first portion having a first and a second longitudinal face, the first and the second confinement zones extending along the layer plane facing the first and the second face of the first portion respectively, the first polarisation means being located on the second face of the first portion and wherein the second polarisation means is located on one of the first and second faces of the first portion of the second region such that polarisation of the second polarisation means modifies the distribution of carriers with the first type of conductivity in the first portion.

12. The semiconducting structure according to claim 1, wherein the first polarisation means comprises a conducting layer separated from the first portion by a layer of insulating material, the conducting layer being located close to the portion of the second semiconducting region with the second type of conductivity.

13. The semiconducting structure according to claim 1, wherein the second semiconducting region also comprises a third confinement zone, the first, the second and the third confinement zones having band gap widths such that emission wavelengths of these confinement zones are distributed over part of the range of visible wavelengths including over most of the range of visible wavelengths, or even over the entire range of visible wavelengths.

14. A semiconducting device comprising a plurality of semiconducting structures that will emit light, the device being characterised in that it comprises at least one semiconducting structure according to claim 1.

* * * * *